United States Patent
Chen et al.

(10) Patent No.: US 10,225,935 B2
(45) Date of Patent: Mar. 5, 2019

(54) POWER CONVERSION DEVICE

(71) Applicant: DELTA ELECTRONICS (THAILAND) PUBLIC COMPANY LIMITED, Samutprakarn (TH)

(72) Inventors: Tie Chen, Samutprakarn (TH); Youzhun Cai, Samutprakarn (TH); Keting Fang, Samutprakarn (TH); Chengfeng Yu, Samutprakarn (TH)

(73) Assignee: DELTA ELECTRONICS (THAILAND) PUBLIC COMPANY LIMITED, Samutprakarn (TH)

( * ) Notice: Subject to any disclaimer, the term of this patent is extended or adjusted under 35 U.S.C. 154(b) by 192 days.

(21) Appl. No.: 15/485,973

(22) Filed: Apr. 12, 2017

(65) Prior Publication Data
US 2018/0206338 A1 Jul. 19, 2018

(51) Int. Cl.
H05K 1/18 (2006.01)
H05K 1/02 (2006.01)
H05K 7/20 (2006.01)

(52) U.S. Cl.
CPC .......... H05K 1/18 (2013.01); H05K 1/0203 (2013.01); H05K 1/0233 (2013.01); H05K 7/20909 (2013.01)

(58) Field of Classification Search
CPC ...... H05K 1/18; H05K 1/0203; H05K 1/0233; H05K 7/20909
See application file for complete search history.

(56) References Cited

U.S. PATENT DOCUMENTS

| | | | | |
|---|---|---|---|---|
| 6,473,291 B1* | 10/2002 | Stevenson | ............... | H01G 4/228 361/301.4 |
| 2005/0083714 A1* | 4/2005 | Zhu | ......................... | H02M 3/28 363/17 |
| 2015/0216090 A1* | 7/2015 | Sakuma | ................. | H05K 7/202 361/697 |
| 2016/0126849 A1* | 5/2016 | Pietrantonio | ..... | H02M 3/33546 363/21.04 |
| 2016/0165716 A1* | 6/2016 | Ido | ........................ | H05K 1/0272 361/722 |
| 2016/0242308 A1* | 8/2016 | Nakazawa | ......... | H02M 3/33576 |
| 2016/0248333 A1* | 8/2016 | Nakazawa | ................. | B60L 1/00 |
| 2017/0182896 A1* | 6/2017 | Masip | ................. | B60L 11/1812 |

* cited by examiner

*Primary Examiner* — James Wu
*Assistant Examiner* — Michael A Matey
(74) *Attorney, Agent, or Firm* — Kirton McConkie; Evan R. Witt

(57) ABSTRACT

A power conversion device includes an input conversion module, an output conversion module, a filtering module and a controlling module, which are installed on a main board. The main board includes a first edge, a second edge, a third edge and a fourth edge. The first edge and the second edge are opposed to each other. The third edge and the fourth edge are opposed to each other. A first part of the input conversion module is located near the first edge and the third edge. A second part of the input conversion module is near the first edge and the fourth edge. An airflow channel is formed between the first part and the second part. The output conversion module is near the second edge. The filtering module is near the second edge. The controlling module is arranged between the first part and the third edge.

20 Claims, 6 Drawing Sheets

POWER CONVERSION DEVICE

CROSS-REFERENCE TO RELATED APPLICATION

This application claims priority to China Patent Application No. 201720043394.8, filed on Jan. 13, 2017, the entire contents of which are incorporated herein by reference for all purposes.

FIELD OF THE DISCLOSURE

The present disclosure relates to a power conversion device, and more particularly to a power conversion device with an airflow channel for facilitating heat dissipation.

BACKGROUND OF THE DISCLOSURE

Nowadays, the trend of developing server power source is developed toward miniaturization and high power density. In the server industry, a power conversion system usually comprises a power rack and plural power conversion devices. The power conversion devices are installed in the power rack. Moreover, these power conversion devices are connected with each other in series or in parallel in order to provide electric power to electronic devices. For increasing the output power of the power conversion system, it is necessary to increase the number of power conversion devices. However, if the width of the power rack is fixed, it is necessary to use the power conversion devices with smaller width.

Moreover, the power conversion device needs a sufficient power transmission area to construct the path between electronic components. As the magnitude of the output current increases, a higher power transmission area is required. Since the power transmission area of the power conversion device that outputs low voltage and large current increases, the width reduction of the power conversion device is limited. The limitation of the width reduction is detrimental to the miniaturization and high power density of the power source. Moreover, since the width of the power conversion device decreases, the electronic components are concentrated along the width direction. Because of the above problems, the heat dissipating efficiency of the electronic components of the power conversion device is usually deteriorated. Consequently, the performance of the power conversion device is unsatisfied.

Therefore, there is a need of providing an improved power conversion device in order to overcome the above drawbacks.

SUMMARY OF THE DISCLOSURE

An object of the present disclosure provides a power conversion device for increasing the heat dissipating efficiency and reducing the layout space in order to overcome the drawbacks of the conventional technology. Consequently, the power conversion device of the present disclosure can provide high power density and meet the requirement of miniaturization.

In accordance with an aspect of the present disclosure, there is provided a power conversion device for transferring a power flow from an input side to an output side. The power conversion device includes a main board, an input conversion module, an output conversion module, a filtering module and a controlling module. The main board includes a first edge, a second edge, a third edge and a fourth edge. The first edge and the second edge are opposed to each other. The third edge and the fourth edge are opposed to each other. The third edge and the fourth edge are arranged between the first edge and the second edge. The first edge is on the input side. The second edge is on the output side. The input conversion module includes a first part and a second part. The first part includes at least one power switch. The second part includes at least one non-power switch. The first part is installed on the main board and located near the first edge and the third edge. The second part is installed on the main board and located near the first edge and the fourth edge. There is a gap between the first part and the second part. An airflow channel is defined by the gap. The output conversion module is installed on the main board and located near the second edge. The filtering module is located near the second edge. The filtering module and the output conversion module are separately installed on the main board. The controlling module is installed on the main board and arranged between the first part and the third edge.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
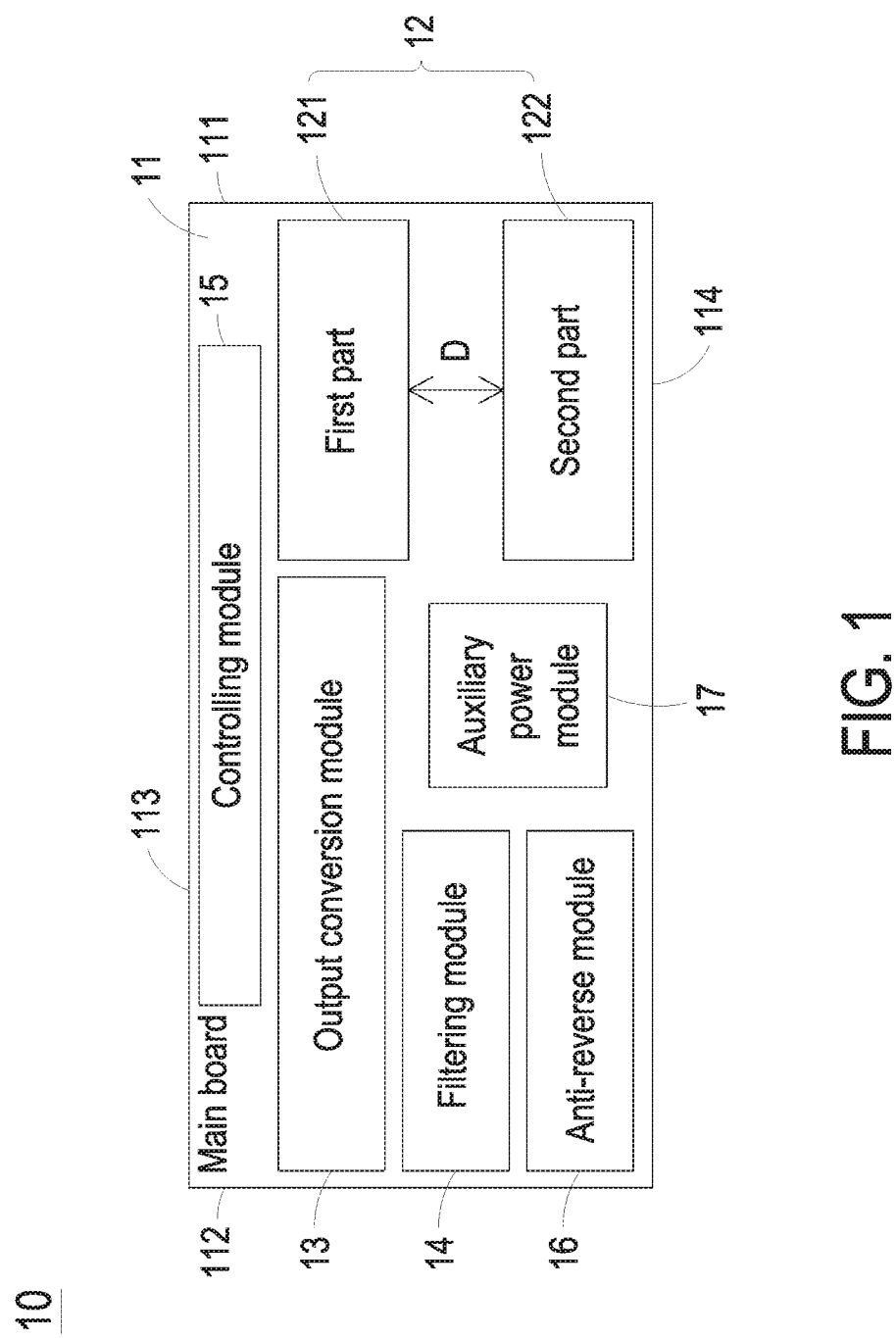
FIG. 1 is a schematic block diagram illustrating a layout structure of a power conversion device according to a first embodiment of the present disclosure.

FIG. 1 is a schematic block diagram illustrating a layout structure of a power conversion device according to a first embodiment of the present disclosure. The electric power flows from an input side to an output side of the power conversion device 10. As shown in FIG. 1, the power conversion device 10 comprises a main board 11, an input conversion module 12, an output conversion module 13, a filtering module 14 and a controlling module 15.

The main board 11 comprises a first edge 111, a second edge 112, a third edge 113 and a fourth edge 114. The first edge 111 and the second edge 112 are opposed to each other. The third edge 113 and the fourth edge 114 are opposed to each other. Moreover, the third edge 113 and the fourth edge 114 are arranged between the first edge 111 and the second edge 112. The first edge 111 is on the input side. The second edge 112 is on the output side.

The input conversion module 12 comprises a first part 121 and a second part 122. The first part 121 comprises at least one power switch. Moreover, the first part 121 is installed on the main board 11 and located near the first edge 111 and the third edge 113. The second part 122 comprises at least one non-power switch. Moreover, the second part 122 is installed on the main board 11 and located near the first edge 111 and the fourth edge 114. There is a gap D between the first part 121 and the second part 122. In an embodiment, the gap D is larger than at least 3 mm.

The output conversion module 13 is installed on the main board 11 and located near the second edge 112.

The filtering module 14 and the output conversion module 13 are separately installed on the main board 11. Moreover, the filtering module 14 is located near the second edge 112.

The controlling module 15 is installed on the main board 11 and arranged between the first part 121 and the third edge 113.

As mentioned above, the first part 121 and the second part 122 of the input conversion module 12 are separated from each other by the gap D, and thus an airflow channel is defined. Due to the airflow channel, the heat generated by the components of the power conversion device 10 can be effectively dissipated. Since the heat generated by the components of the power conversion device 10 can be effectively dissipated, the performance of the power conversion device 10 is increased, the power density is enhanced and the cost is reduced. Consequently, the drawbacks of the conventional technology are overcome.

Please refer to FIG. 1 again. The power conversion device 10 further comprises an anti-reverse module 16 and an auxiliary power module 17. The anti-reverse module 16, the output conversion module 13 and the filtering module 14 are separately installed on the main board 11. The anti-reverse module 16 is located near the second edge 112. The output conversion module 13 is located near the second edge 112 and the third edge 113. The filtering module 14 is arranged between the output conversion module 13 and the anti-reverse module 16, and located near the second edge 112. The controlling module 15 is arranged between the output conversion module 13 and the third edge 113. It is noted that the locations of the output conversion module 13, the filtering module 14 and the anti-reverse module 16 are not restricted. The auxiliary power module 17 is installed on the main board 11, and arranged between the second part 122, the filtering module 14 and the anti-reverse module 16.

Optionally, the power conversion device 10 further comprises a fan (not shown). The fan is arranged between the first part 121, the second part 122 and the first edge 111 for generating airflow to the airflow channel (i.e., the gap D). In some embodiments, the output conversion module 13 and the filtering module 14 are separated from each other by a specified distance in the width direction, and the output conversion module 13 and the auxiliary power module 17 are separated from each other by another distance. Consequently, additional airflow channels are defined. The additional airflow channels and the airflow channel between the first part 121 and the second 122 (i.e., the gap D) are in communication with each other. Consequently, the overall heat dissipating efficiency is enhanced.

Figure 2:
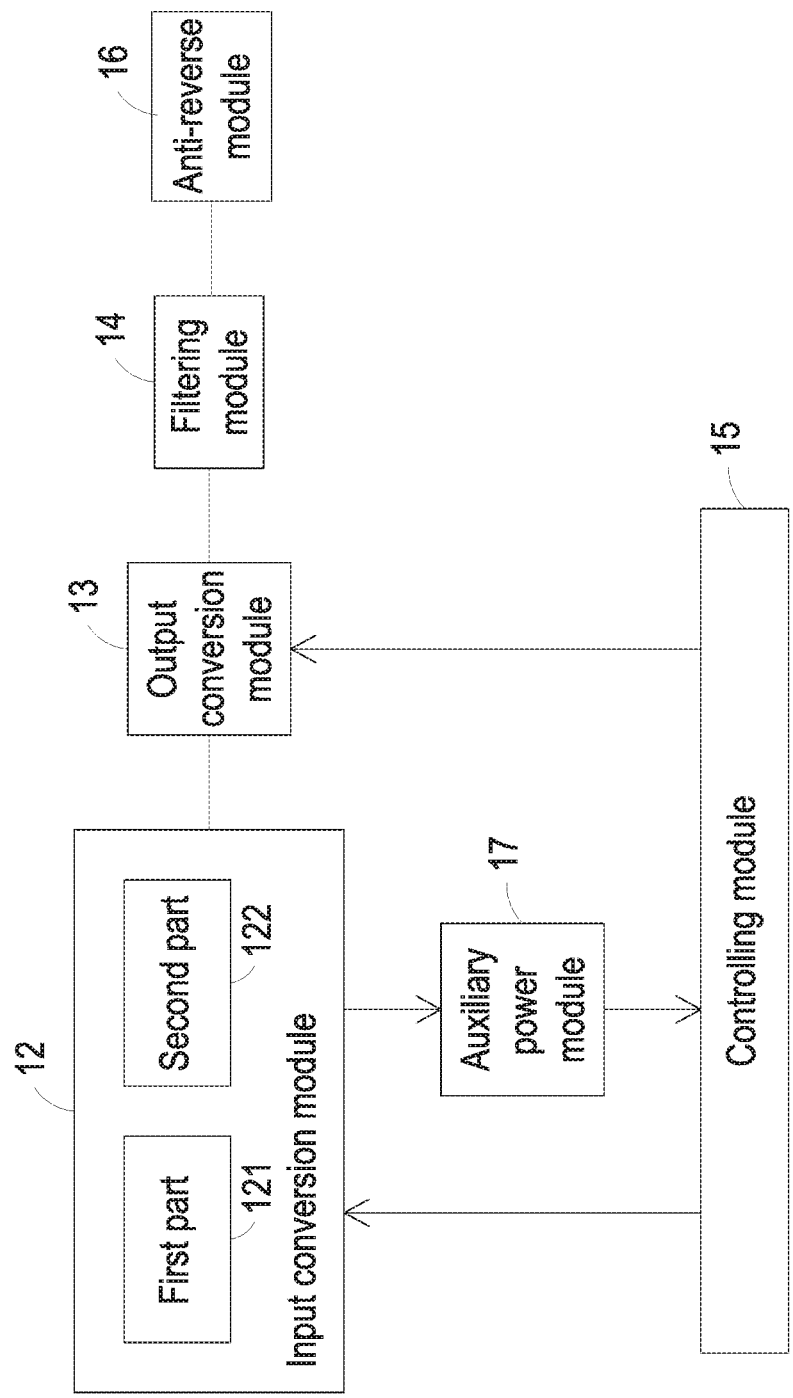
FIG. 2 is a schematic circuit diagram illustrating the power conversion device as shown in FIG. 1.

FIG. 2 is a schematic circuit diagram illustrating the power conversion device as shown in FIG. 1. The circuit diagram of FIG. 2 is employed to describe the connecting relationships between the components of FIG. 1. The locations of these components have been described in FIG. 1. The input conversion module 12 is used for converting an input voltage into an intermediate voltage. The first part 121 of the input conversion module 12 comprises a power switch. The second part 122 of the input conversion module 12 comprises non-power switches. The non-power switches include inductors, capacitors and/or diodes. The output conversion module 13 is used for converting the intermediate voltage into an output voltage. The output conversion module 13 is electrically connected with an output terminal of the input conversion module 12. The filtering module 14 is electrically connected with an output terminal of the output conversion module 13 in order to filter off the non-DC component of the output voltage. The anti-reverse module 16 is electrically connected with an output terminal of the filtering module 14. The anti-reverse module 16 is used for preventing a reverse current from flowing into the filtering module 14. The controlling module 15 is electrically connected with the input conversion module 12 and the output conversion module 13 in order to control the operations of the input conversion module 12 and the output conversion module 13. The auxiliary power module 17 is electrically connected between the input conversion module 12 and the controlling module 15 in order to provide electricity to the controlling module 15.

Figure 3:
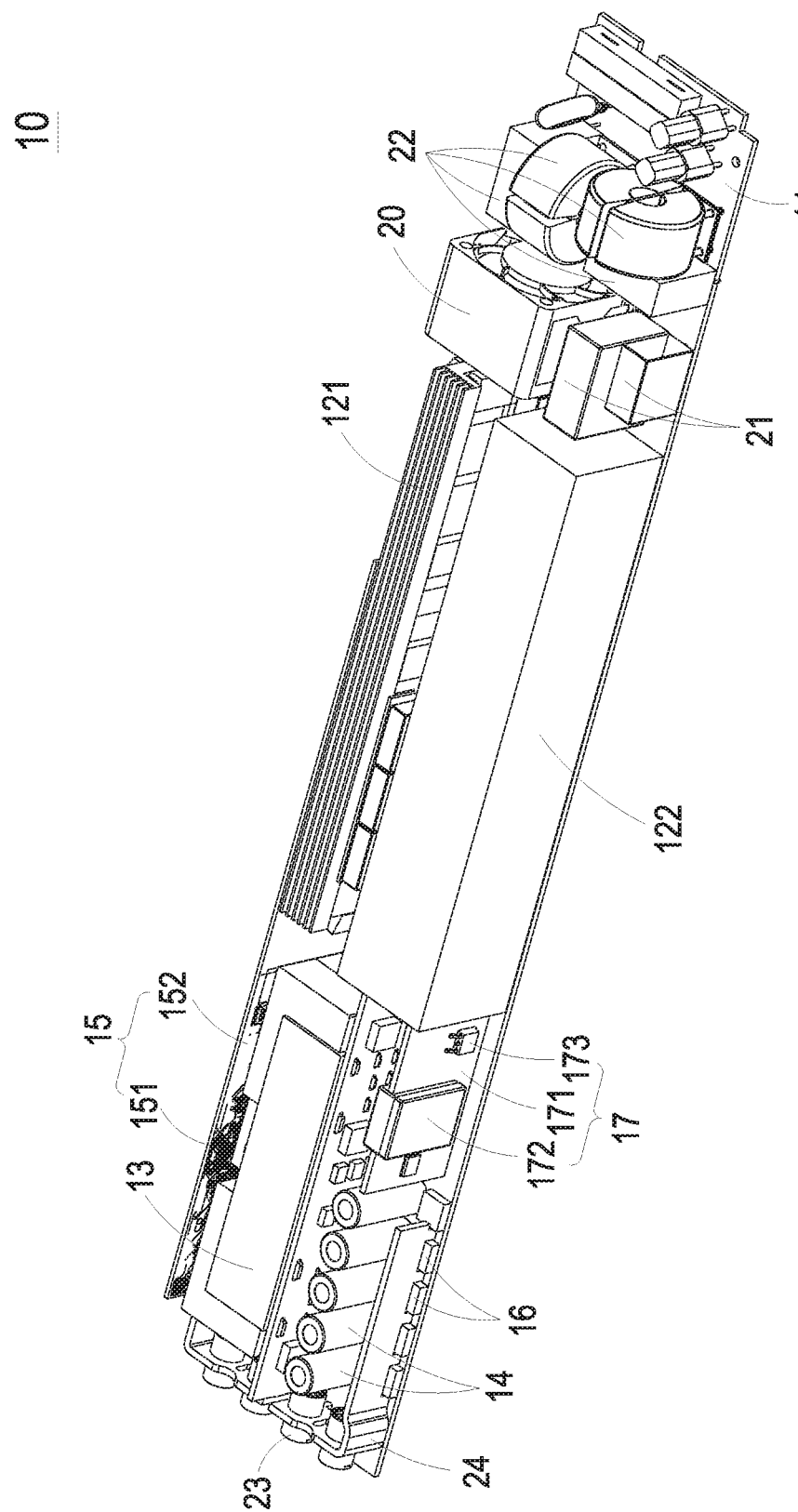
FIG. 3 is a schematic perspective view illustrating the layout structure of the power conversion device as shown in FIG. 1.

FIG. 3 is a schematic perspective view illustrating the layout structure of the power conversion device as shown in FIG. 1. As shown in FIGS. 1 and 3, the power conversion device 10 comprises the main board 11, the first part 121 and the second part 122 of the input conversion module 12, the output conversion module 13, the filtering module 14 and the controlling module 15. Moreover, as shown in FIG. 3, the power conversion device 10 further comprises a fan 20, a peak current suppression module 21, an EMI filtering circuit 22, an output terminal 23 and an output bus 24. The input conversion module 12 is located beside the fan 20. That is, both of the first part 121 and the second part 122 are located beside the fan 20. Since the first part 121 comprises the power switch, the first part 121 generates a great deal amount of heat. However, since the fan 20 is located beside the first part 121, a greater portion of the heat can be dissipated away by the airflow that is generated by the fan 20. The output conversion module 13 is farther than the input conversion module 12 with respect to the fan 20. Since there is an airflow channel between the first part 121 and the second part 122, the heat of the output conversion module 13 can still be effectively dissipated away.

The output bus 24 is made of conductive material such as copper. In addition, the output bus 24 is a metal plate. The output bus 24 is vertically soldered on the main board 11 through pins (not shown). The output terminal 23 is connected with the output bus 24 through a riveting means. Moreover, the output bus 24 is located beside the anti-reverse module 16. The power flow is transferred from the output conversion module 13 to the output terminal 23 through the anti-reverse module 16 and the output bus 24 sequentially. Since electric connection between the anti-reverse module 16 and the output terminal 23 is established through the output bus 24, the conduction distance between the anti-reverse module 16 and the output terminal 23 is minimized. Under this circumstance, the power loss is reduced and the performance is enhanced. Moreover, since the output bus 24 is a metal plate vertically installed on the main board 11, the width of the output bus 24 in the overall layout structure is decreased. Consequently, the power density is increased, and the airflow is guided more easily. The filtering module 14 and the output conversion module 13 are separately installed on the main board 11. As shown in FIG. 3, the controlling module 15 comprises a controller 151 and a first circuit board 152. The controller 151 is installed on the first circuit board 152. In addition, the first circuit board 152 is inserted in the main board 11.

Please refer to FIG. 3 again. The auxiliary power module 17 comprises a second circuit board 171, an auxiliary transformer 172 and an auxiliary power source 173. The auxiliary transformer 172 and the auxiliary power source 173 are installed on the second circuit board 171. The second circuit board 171 is inserted in the main board 11. In this embodiment, the auxiliary transformer 172 is a planar transformer. Since the auxiliary power module 17 is a flat structure, the width of the auxiliary power module 17 in the overall layout structure is reduced. Consequently, the power density is further increased. Moreover, the auxiliary power module 17 is installed on the main board 11, and arranged between the input conversion module 12, the filtering module 14 and the anti-reverse module 16. Since the auxiliary power module 17 is arranged in the path of the airflow channel, the airflow can be guided to the auxiliary power module 17 more easily. Under this circumstance, the heat dissipating efficiency is enhanced.

It is noted that the locations of the output conversion module 13, the filtering module 14, the anti-reverse module 16 and the auxiliary power module 17 of the power conversion device 10 are not restricted. That is, the locations of the output conversion module 13, the filtering module 14, the anti-reverse module 16 and the auxiliary power module 17 may be varied according to the practical requirements. Some variant examples will be described as follows. In the variant examples, the output bus is not shown. In practice, the power conversion devices of the variant examples comprise the output bus, and the functions of the output bus are similar to those of the first embodiment.

Figure 4:
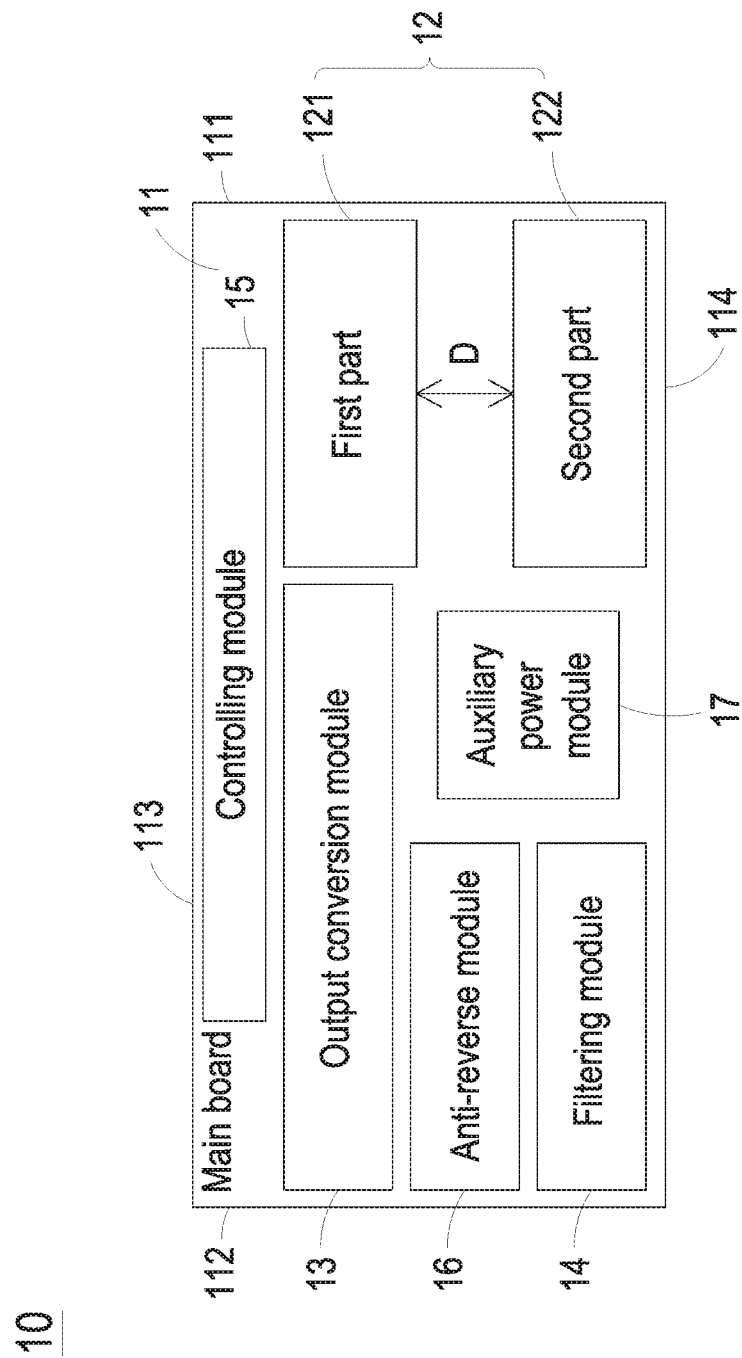
FIG. 4 is a schematic block diagram illustrating a layout structure of a power conversion device according to a second embodiment of the present disclosure.

FIG. 4 is a schematic block diagram illustrating a layout structure of a power conversion device according to a second embodiment of the present disclosure. Comparing with FIG. 1, the output conversion module 13 is located near the second edge 112 and the controlling module 15. The filtering module 14 is located near the second edge 112 and the fourth edge 114. The anti-reverse module 16 is arranged between the filtering module 14 and the output conversion module 13, and located near the second edge 112. The auxiliary power module 17 is arranged between the input conversion module 12, the filtering module 14 and the anti-reverse module 16. The controlling module 15 is arranged between the output conversion module 13 and the third edge 113. The other components of this embodiment are similar to those of the first embodiment, and are not redundantly described herein.

Figure 5:
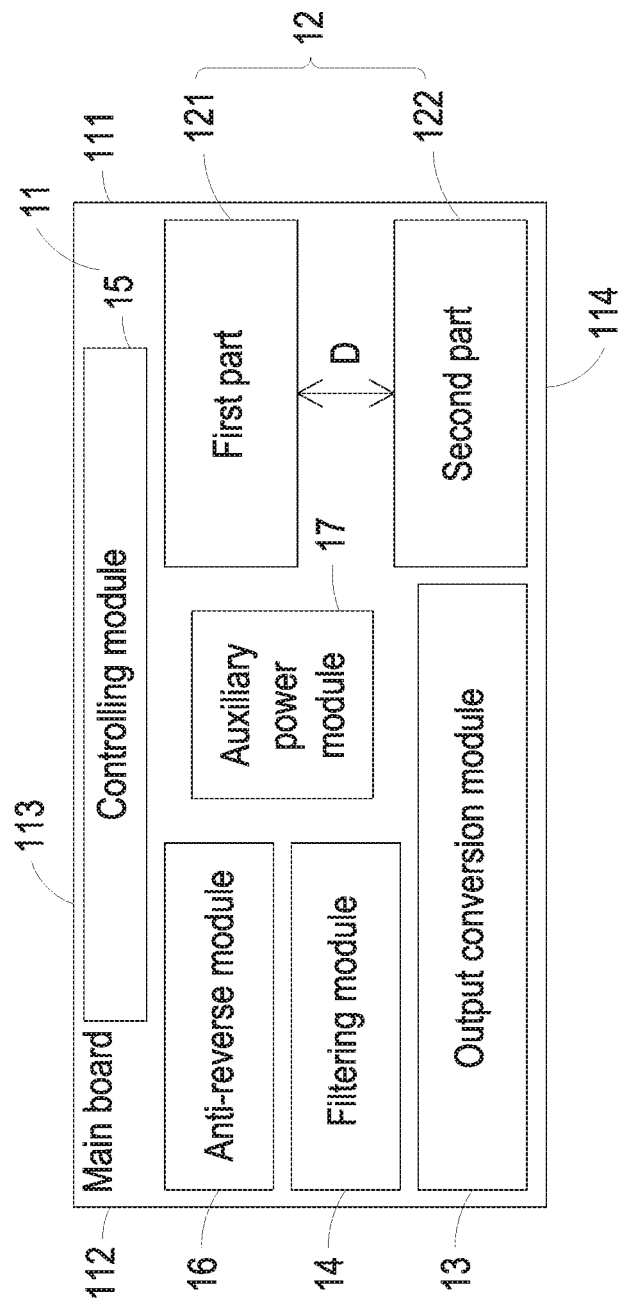
FIG. 5 is a schematic block diagram illustrating a layout structure of a power conversion device according to a third embodiment of the present disclosure.

FIG. 5 is a schematic block diagram illustrating a layout structure of a power conversion device according to a third embodiment of the present disclosure. Comparing with FIG. 1, the anti-reverse module 16 is located near the second edge 112 and the controlling module 15. The output conversion module 13 is located near the second edge 112 and the fourth edge 114. The filtering module 14 is arranged between the filtering module 14 and the output conversion module 13, and located near the second edge 112. The auxiliary power module 17 is arranged between the input conversion module 12, the filtering module 14 and the anti-reverse module 16. The controlling module 15 is arranged between the anti-reverse module 16 and the third edge 113. The other components of this embodiment are similar to those of the first embodiment, and are not redundantly described herein.

Figure 6:
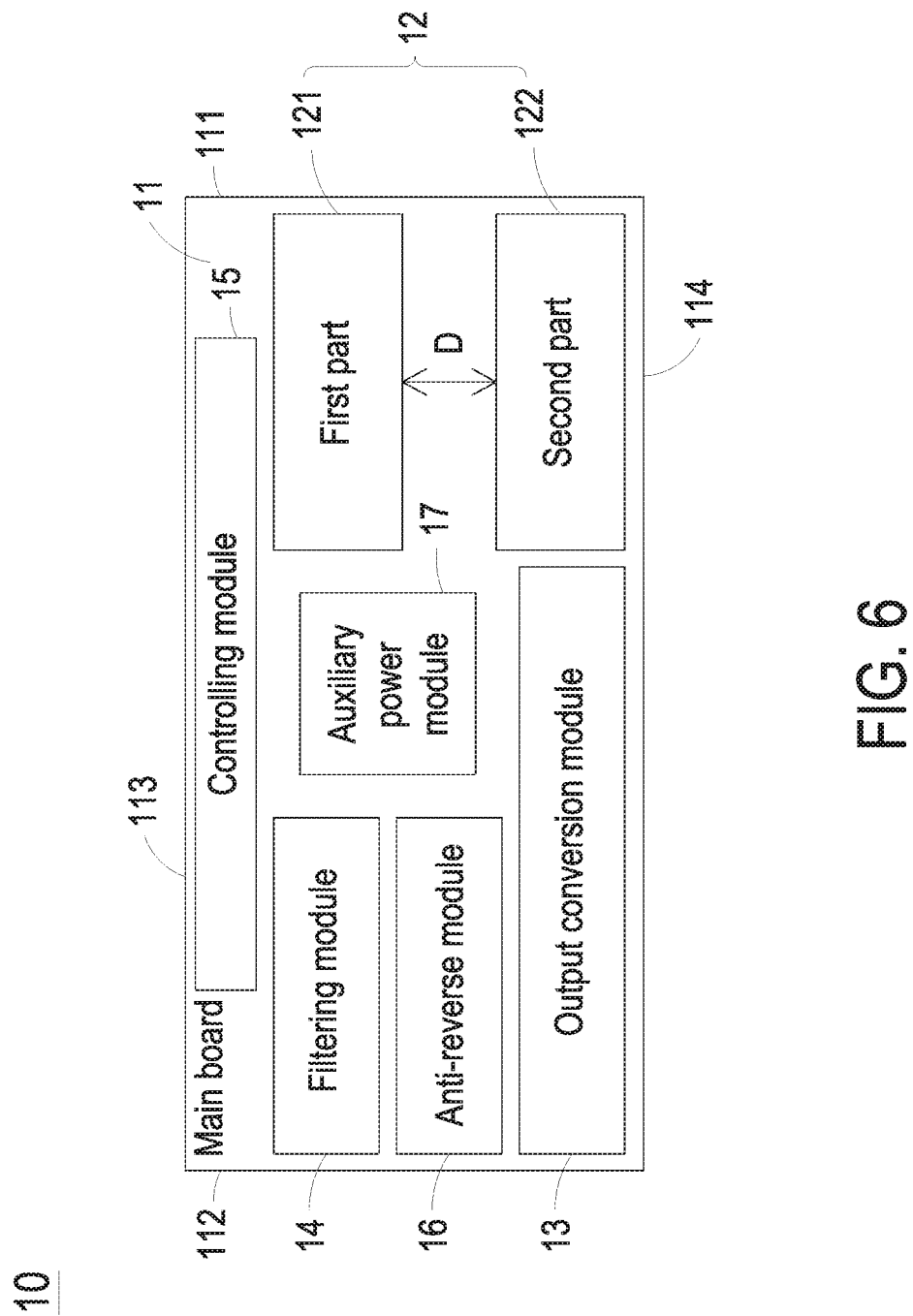
FIG. 6 is a schematic block diagram illustrating a layout structure of a power conversion device according to a fourth embodiment of the present disclosure.

FIG. 6 is a schematic block diagram illustrating a layout structure of a power conversion device according to a fourth embodiment of the present disclosure. Comparing with FIG. 1, the filtering module 14 is located near the second edge 112 and the controlling module 15. The output conversion module 13 is located near the second edge 112 and the fourth edge 114. The anti-reverse module 16 is arranged between the filtering module 14 and the output conversion module 13, and located near the second edge 112. The auxiliary power module 17 is arranged between the input conversion module 12, the filtering module 14 and the anti-reverse module 16. The controlling module 15 is arranged between the filtering module 14 and the third edge 113. The other components of this embodiment are similar to those of the first embodiment, and are not redundantly described herein.

From the above descriptions, the present disclosure provides the power conversion device. The input conversion module includes a first part and a second part. The first part includes at least one power switch. The second part includes at least one non-power switch. There is a gap between the first part and the second part. Consequently, an airflow channel is defined. Due to the airflow channel, the heat generated by the components of the power conversion device can be effectively dissipated. Since the output conversion module and the output terminal are located beside each other, the power loss and the heat generated by the output conversion module are reduced. In other words, the power conversion device of the present disclosure has many benefits such as enhanced heat dissipating efficiency, reduced layout space, enhanced performance, increased power density and reduced cost.

While the disclosure has been described in terms of what is presently considered to be the most practical and preferred embodiments, it is to be understood that the disclosure needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A power conversion device for transferring a power flow from an input side to an output side, the power conversion device comprising:
   a main board comprising a first edge, a second edge, a third edge and a fourth edge, wherein the first edge and the second edge are opposed to each other, the third edge and the fourth edge are opposed to each other, the third edge and the fourth edge are arranged between the first edge and the second edge, the first edge is on the input side, and the second edge is on the output side;
   an input conversion module comprising a first part and a second part, wherein the first part comprises at least one power switch, the second part comprises at least one non-power switch, the first part is installed on the main board and located near the first edge and the third edge, the second part is installed on the main board and located near the first edge and the fourth edge, and there is a gap between the first part and the second part, wherein an airflow channel is defined by the gap;
   an output conversion module installed on the main board and located near the second edge;
   a filtering module located near the second edge, wherein the filtering module and the output conversion module are separately installed on the main board; and
   a controlling module installed on the main board and arranged between the first part and the third edge.

2. The power conversion device according to claim 1, wherein the gap is larger than at least 3 mm.

3. The power conversion device according to claim 1, wherein the output conversion module is electrically connected with an output terminal of the input conversion module, the filtering module is electrically connected with an output terminal of the output conversion module, and the controlling module is electrically connected with the input conversion module and the output conversion module so as to control operations of the input conversion module and the output conversion module.

4. The power conversion device according to claim 1, wherein the controlling module comprises at least one controller and a first circuit board, wherein the at least one controller is installed on the first circuit board, and the first circuit board is inserted in the main board.

5. The power conversion device according to claim 1, further comprising an anti-reverse module, wherein the anti-reverse module, the output conversion module and the filtering module are separately installed on the main board, and located near the second edge.

6. The power conversion device according to claim 5, wherein the anti-reverse module is electrically connected with an output terminal of the filtering module so as to prevent a reverse current from flowing into the filtering module.

7. The power conversion device according to claim 5, wherein the output conversion module is located near the fourth edge, the anti-reverse module is located near the controlling module, and the filtering module is arranged between the output conversion module and the anti-reverse module.

8. The power conversion device according to claim 7, further comprising an auxiliary power module, wherein the auxiliary power module is electrically connected with the input conversion module, installed on the main board, and arranged between the first part, the filtering module and the anti-reverse module, wherein the auxiliary power module comprises a second circuit board, an auxiliary transformer and an auxiliary power source, wherein the auxiliary transformer and the auxiliary power source are installed on the second circuit board, and the second circuit board is inserted in the main board.

9. The power conversion device according to claim 8, wherein the auxiliary transformer is a planar transformer.

10. The power conversion device according to claim 5, wherein the output conversion module is located near the fourth edge, the filtering module is located near the controlling module, and the anti-reverse module is arranged between the output conversion module and the filtering module.

11. The power conversion device according to claim 10, further comprising an auxiliary power module, wherein the auxiliary power module is electrically connected with the input conversion module, installed on the main board, and arranged between the first part, the filtering module and the anti-reverse module, wherein the auxiliary power module comprises a second circuit board, an auxiliary transformer and an auxiliary power source, wherein the auxiliary transformer and the auxiliary power source are installed on the second circuit board, and the second circuit board is inserted in the main board.

12. The power conversion device according to claim 11, wherein the auxiliary transformer is a planar transformer.

13. The power conversion device according to claim 5, wherein the anti-reverse module is located near the fourth edge, the output conversion module is located near the controlling module, and the filtering module is arranged between the output conversion module and the anti-reverse module.

14. The power conversion device according to claim 13, further comprising an auxiliary power module, wherein the auxiliary power module is electrically connected with the input conversion module, installed on the main board, and arranged between the second part, the filtering module and the anti-reverse module, wherein the auxiliary power module comprises a second circuit board, an auxiliary transformer and an auxiliary power source, wherein the auxiliary transformer and the auxiliary power source are installed on the second circuit board, and the second circuit board is inserted in the main board.

15. The power conversion device according to claim 14, wherein the auxiliary transformer is a planar transformer.

16. The power conversion device according to claim 5, wherein the filtering module is located near the fourth edge, the output conversion module is located near the controlling module, and the anti-reverse module is arranged between the output conversion module and the filtering module.

17. The power conversion device according to claim 16, further comprising an auxiliary power module, wherein the auxiliary power module is electrically connected with the input conversion module, installed on the main board, and arranged between the second part, the filtering module and the anti-reverse module, wherein the auxiliary power module comprises a second circuit board, an auxiliary transformer and an auxiliary power source, wherein the auxiliary transformer and the auxiliary power source are installed on the second circuit board, and the second circuit board is inserted in the main board.

18. The power conversion device according to claim 17, wherein the auxiliary transformer is a planar transformer.

19. The power conversion device according to claim 5, wherein the power conversion device further comprises an output bus and an output terminal, wherein the output bus is vertically installed on the main board and connected with the output terminal, and the output bus is located beside the anti-reverse module.

20. The power conversion device according to claim 1, further comprising a fan, wherein the fan is installed on the main board and arranged between the first part, the second part and the first edge, and the fan generates an airflow to the airflow channel.

* * * * *